(12) United States Patent
Lin

(10) Patent No.: US 8,609,996 B2
(45) Date of Patent: Dec. 17, 2013

(54) PRINTED CIRCUIT BOARD AND LAYOUT METHOD THEREOF

(71) Applicant: Hon Hai Precision Industry Co., Ltd., New Taipei (TW)

(72) Inventor: Yu-Hsu Lin, Santa Clara, CA (US)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/715,054

(22) Filed: Dec. 14, 2012

(65) Prior Publication Data

US 2013/0098661 A1 Apr. 25, 2013

Related U.S. Application Data

(63) Continuation of application No. 12/759,011, filed on Apr. 13, 2010, now Pat. No. 8,336,203.

(30) Foreign Application Priority Data

Dec. 1, 2009 (CN) .......................... 2009 1 0310726

(51) Int. Cl.
*H05K 1/11* (2006.01)

(52) U.S. Cl.
USPC ............................................ 174/261; 174/255

(58) Field of Classification Search
USPC ........................................ 174/250, 255, 261
See application file for complete search history.

(56) References Cited

U.S. PATENT DOCUMENTS

2002/0053899 A1* 5/2002 Adamian et al. ............ 324/76.19
2010/0237961 A1* 9/2010 Pai et al. ............................ 333/4
2012/0032749 A1* 2/2012 Shiue et al. ........................ 333/5

* cited by examiner

*Primary Examiner* — Jeremy Norris
(74) *Attorney, Agent, or Firm* — Altis Law Group, Inc.

(57) ABSTRACT

A printed circuit board includes a signal layer having a pair of differential transmission lines thereon. An eye width and an eye height of an eye diagram obtained at output terminals of the pair of differential transmission lines are variable according to a distance between the pair of differential transmission lines. The eye width and the eye height of the eye diagram are at minimum values when the distance between the pair of differential transmission lines is at a first distance. The eye width and the eye height meet requirements of the pair of differential transmission lines for the eye diagram when the distance between the pair of differential transmission lines is set at a second distance, the second distance is less than the first distance.

10 Claims, 5 Drawing Sheets

PRINTED CIRCUIT BOARD AND LAYOUT METHOD THEREOF

CROSS-REFERENCE

This is a continuation case of U.S. patent application Ser. No. 12/759,011 filed on Apr. 13, 2010, entitled "PRINTED CIRCUIT BOARD AND LAYOUT METHOD THEREOF", the entire contents of which are herein incorporated by reference.

BACKGROUND

1. Technical Field

The present disclosure relates to a printed circuit board and layout method thereof.

2. Description of Related Art

Printed circuit boards are designed for coupling control chips to electronic devices, to transmit signals such as high-speed differential signals. Mutual capacitance is the coupling of two electric fields. Similarly, if two conductors are in close proximity with each other, a voltage, mutual inductance, will be generated in the second conductor as a result.

Crosstalk is the electrical "noise" caused by mutual inductance and mutual capacitance between signal conductors, due to the close proximity of the signal conductors to each other. Crosstalk can cause digital system failure due to false signals appearing on a receiver. A typical layout method for reducing the crosstalk is to increase the distance between the two conductors. However, such a method increases the sizes and the production cost of the circuit boards.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
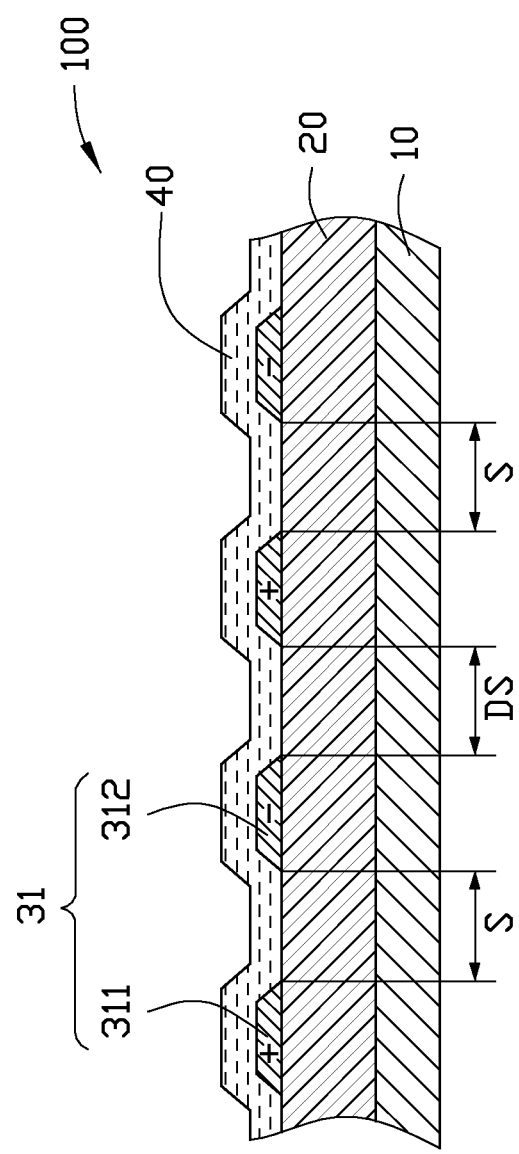
FIG. 1 is an isometric view of a printed circuit board, in accordance with one embodiment; the printed circuit board includes at least one pair of differential transmission lines.

Referring to FIG. 1, a printed circuit board includes a reference layer 10, a signal layer 20, and a solder mask 40 arrayed in sequence from top to bottom. The signal layer 20 has at least a pair of differential transmission lines 31 thereon. Each of the pair of differential transmission lines 31 includes a first transmission line 311, and a second transmission line 312. A width of each of the first and the second transmission lines 311 and 312 is W. A thickness of each of the first and the second transmission lines 311 and 312 is T. A length of each of the first and the second transmission lines 311 and 312 is L. A distance between the first and the second transmission lines 311 and 312 is S. A distance between one of the pair of differential transmission lines 31 and another is DS. A thickness of the signal layer 20 is H. A thickness of the solder mask 40 is Tm. In one embodiment, W is 5 mils, T is 1.9 mils, L is 12 inches, S is 7 mils, H is 4.2 mils, and Tm is 0.7 mils. A dielectric constant of the signal layer 20 is 4.1, and a dielectric constant of the solder mask 40 is 3.4. The distance S is a value, which is determined by characteristic impedance, W, T, H, Tm, and the dielectric constant of the signal layer 20 and the solder mask 40. The input terminals of each of the pair of differential transmission lines 31 are electrically coupled to a signal generator (not shown). The output terminals of each of the pair of differential transmission lines 31 are electrically coupled to an oscillograph (not shown). In one embodiment, a data transfer rate of the signal generator is 8 bits per second, a error rate of the oscillograph is 1E-12.

Figure 2:
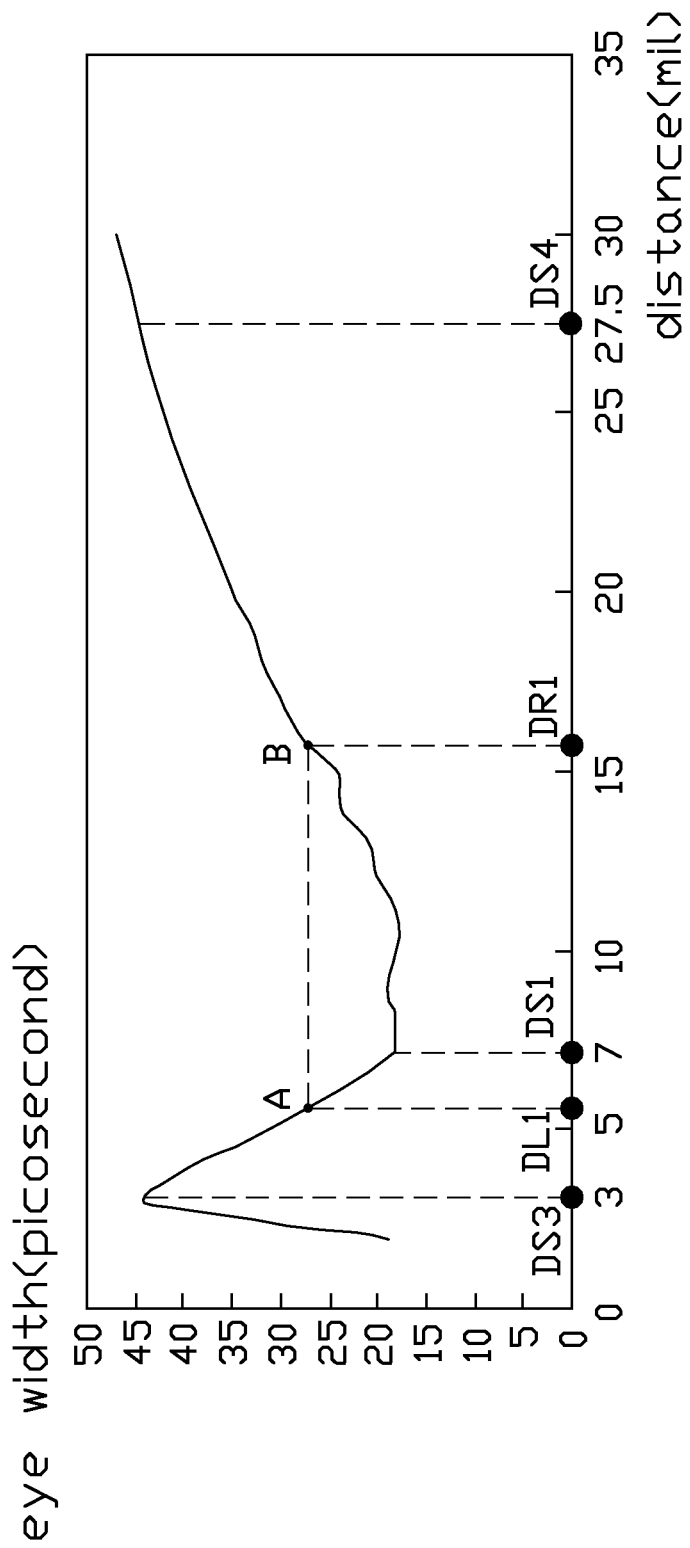
FIG. 2 is an oscillographic trace showing a signal waveform of a relationship between the differential transmission lines distance and eye width in an eye diagram, in accordance with an embodiment.
Figure 3:
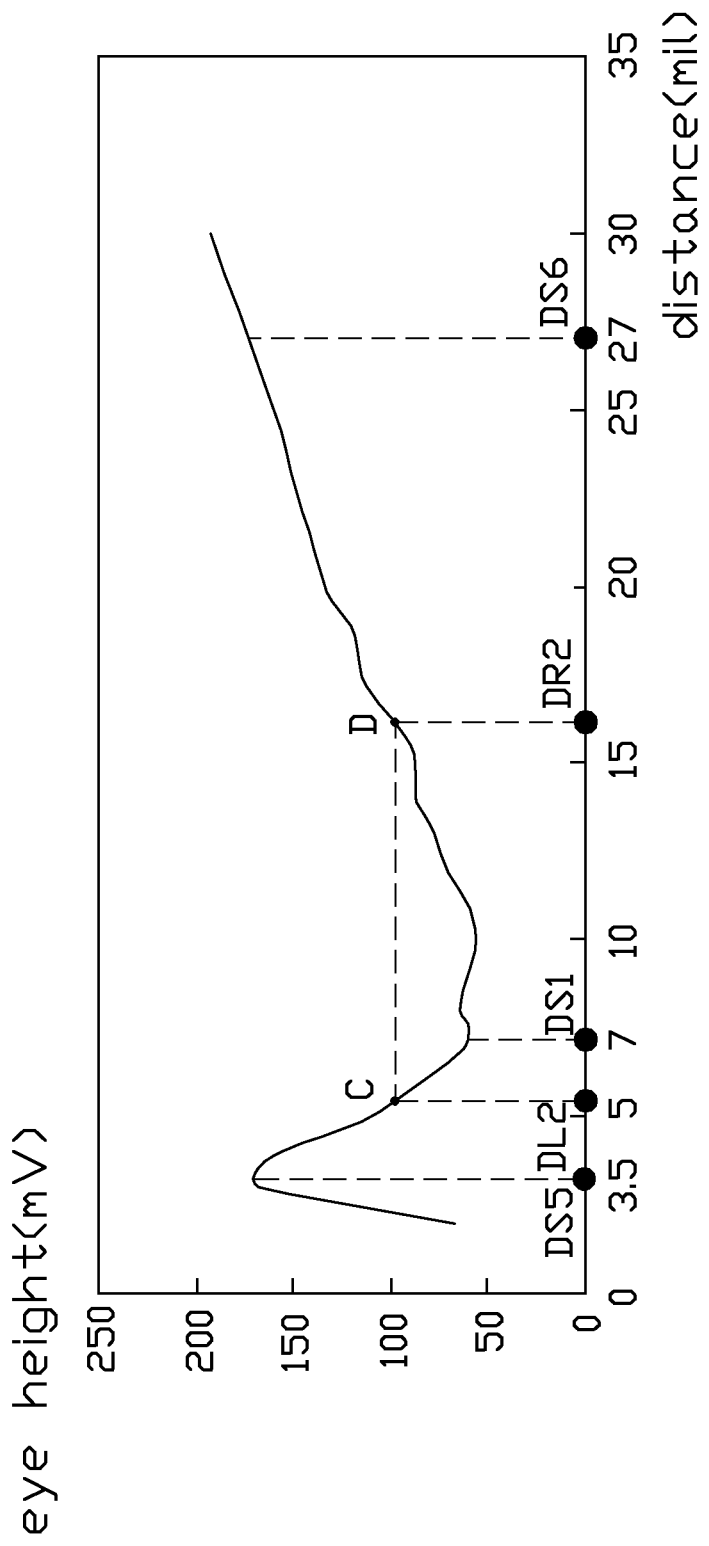
FIG. 3 is an oscillographic trace showing a signal waveform of a relationship between the differential transmission lines distance and eye height in an eye diagram, in accordance with the embodiment of FIG. 2.

Referring to FIGS. 2 and 3, in simulation, the distance DS is changed to obtain a signal waveform of a relationship between the distance DS and eye width in eye diagram as shown in FIG. 2, and a signal waveform of a relationship between the distance DS and eye height in eye diagram as shown in FIG. 3. Referring to FIG. 2, the distance DS is capable of being set to a first distance DS1 which minimizes an eye width of the eye diagram. When the distance DS is greater or less than the first distance DS1, eye width of the eye diagram increases. The distance DS is further capable of being set to a third distance DS3 less than the first distance DS1, which makes eye width of the eye diagram reach a maximum value. The distance DS is also capable of being set to a fourth distance DS4 greater than the first distance DS1 corresponding to an eye width equal to the eye width corresponding to the third distance DS3. In one embodiment, the first distance DS1 is 7 mils, the third distance DS3 is 3 mils, and the fourth distance DS4 is 27.5 mils.

The signal waveform is a non symmetric parabola with a left threshold point A, and a right threshold point B. The left threshold point A corresponds to a left threshold distance DL1 of the distance DS. The right threshold point B corresponds to a right threshold distance DR1 of the distance DS. An eye width of the eye diagram corresponds to where the left threshold point A meets requirements of the pair of differential transmission lines 31 for the eye diagram. An eye width of the eye diagram corresponds to where the right threshold point B meets requirements of the pair of differential transmission lines 31 for the eye diagram. Eye widths of the eye diagram corresponding to the other points between the left and right threshold points A and B do not meet requirements of the pair of differential transmission lines 31 for the eye diagram. Therefore, the distance DS is set as a second distance less than or equal to the left threshold distance DL1, or greater than or equal to the third distance DS3. In a prior layout method, the distance DS is increased to the fourth distance DS4 to increase the eye width. The simulation according to the set conditions shows that the layout space can be saved when the distance DS is set at the second distance. For example, when the third distance DS3 is set as the distance DS, a 24.5 mils of layout space can be saved.

Referring to FIG. 3, the distance DS is further capable of being set to a fifth distance DS5 less than the first distance DS1 which maximizes eye height of the eye diagram. The distance DS is also capable of being set to a sixth distance DS6 greater than the first distance DS1 corresponding to an eye height equal to the eye height corresponding to the fifth distance DS5. In one embodiment, the fifth distance DS5 is 3.5 mils, and the sixth distance DS6 is 27 mils.

The signal waveform has a left threshold point C, and a right threshold point D. The left threshold point C corresponds to a left threshold distance DL2 of the distance DS. The right threshold point D corresponds to a right threshold distance DR2 of the distance DS. An eye height of the eye diagram corresponds to the left threshold point C meets a requirement of the pair of differential transmission lines 31 for the eye diagram. An eye height of the eye diagram corresponds to the right threshold point D meets a requirement of the par of differential transmission lines 31 for the eye diagram. Eye heights of the eye diagram correspond to the other points between the left and right threshold points C and D do not meet the requirements of the pair of differential transmission lines 31 for the eye diagram. Therefore, the distance DS is set as a second distance less than or equal to the left threshold distance DL2, or greater than or equal to the fifth distance DS5. In a prior layout method, the distance DS is increased to the sixth distance DS6 to increase the eye height. The simulation according to the set conditions shows that layout space can be saved when the distance DS is set to the second distance. For example, when the fifth distance DS5 is set to the distance DS, 23.5 mils layout space can be saved.

Usually a second distance corresponding to the eye width is equal to that of the eye height. When a first second distance corresponding to the eye width is not equal to a second second distance corresponding to the eye height, the greater one of the first and second second distances is set as the second distance.

Figure 4:
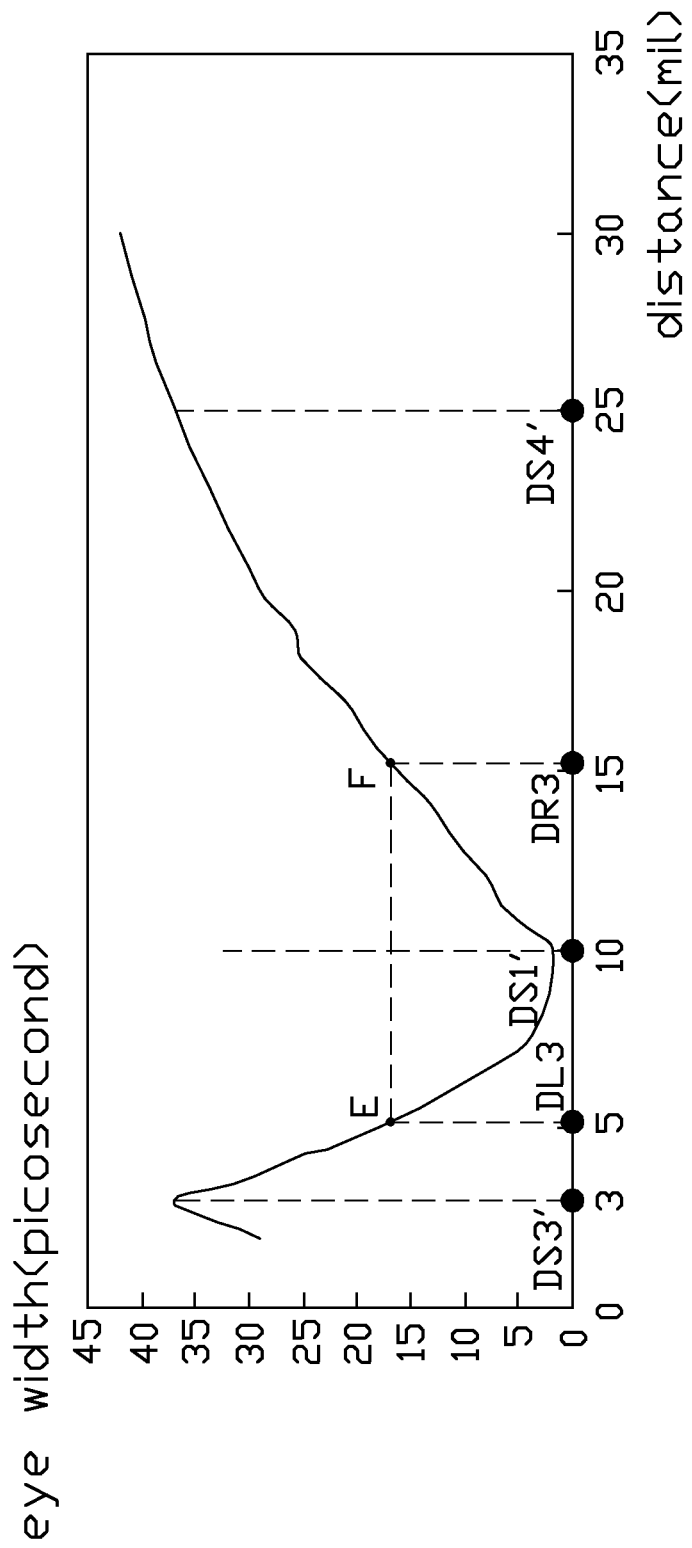
FIG. 4 is an oscillographic trace showing a signal waveform of a relationship between the differential transmission lines distance and eye width in an eye diagram, in accordance with another embodiment.
Figure 5:
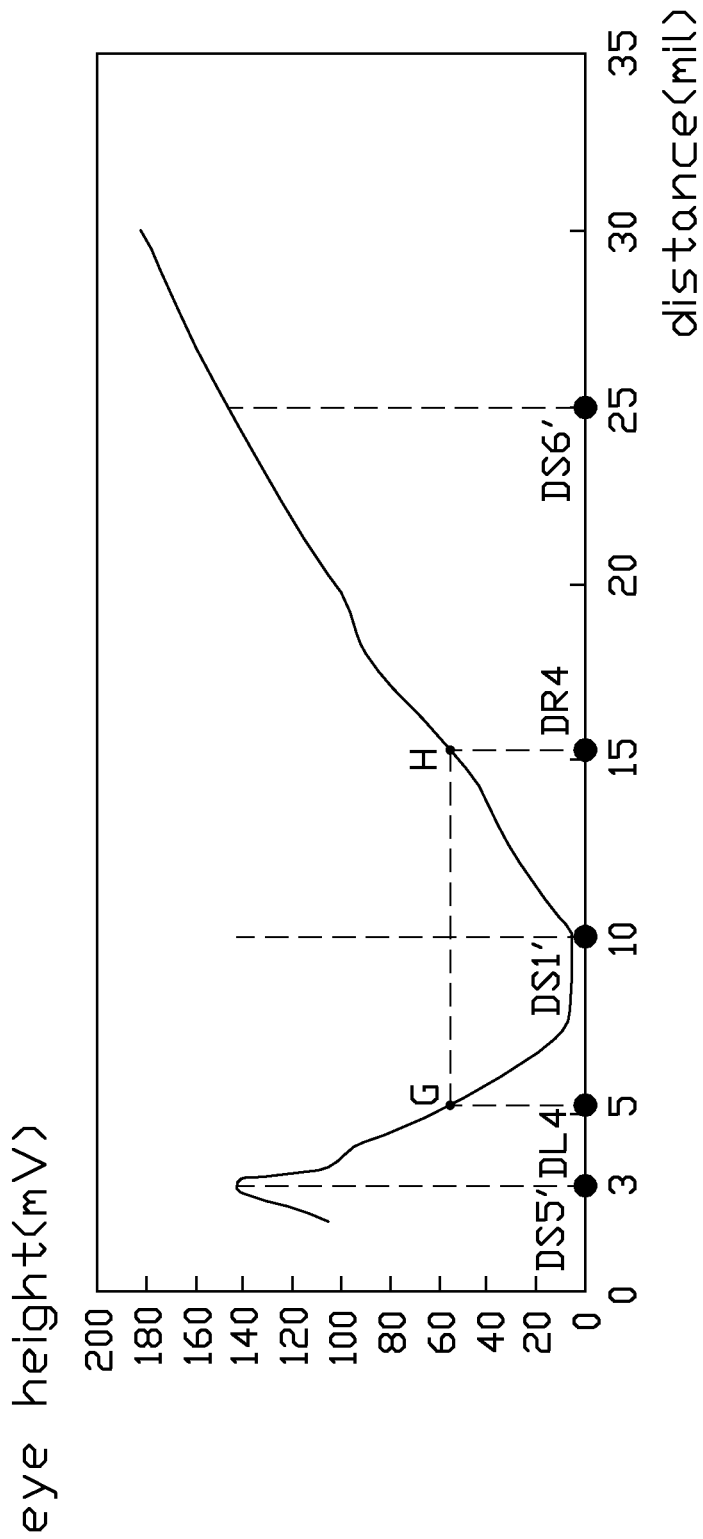
FIG. 5 is an oscillographic trace showing a signal waveform of a relationship between the differential transmission lines distance and eye height in an eye diagram, in accordance with the embodiment of FIG. 4.

In another embodiment, W is 5 mils, T is 1.9 mils, L is 12 inches, S is 10 mils, H is 4.2 mils, and Tm is 0.7 mils. A dielectric constant of the signal layer 20 is 4.1, and a dielectric constant of the solder mask 40 is 3.4. Referring to FIGS. 4 and 5, in simulation, to obtain a signal waveform of relationship between the distance DS and eye width in eye diagram as shown in FIG. 4, the distance DS is changed. In addition, a signal waveform of relationship between the distance DS and eye height in eye diagram as shown in FIG. 5. Referring to FIG. 4, the distance DS is capable of being set to a first distance DS1' which makes an eye width of the eye diagram to reach a minimum value. When the distance DS is greater or less than the first distance DS1', an eye width of the eye diagram increases. The distance DS is further capable of being set to a third distance DS3' less than the first distance DS1', which makes an eye width of the eye diagram to reach a maximum value. The distance DS is also capable of being set to a fourth distance DS4' greater than the first distance DS1' corresponding to an eye width equal to the eye width corresponding to the third distance DS3'. In one embodiment, the first distance DS1' is 10 mils, the third distance DS3' is 3 mils, and the fourth distance DS4' is 25 mils.

The signal waveform has a left threshold point E, and a right threshold point F. The left threshold point E corresponds to a left threshold distance DL3 of the distance DS. The right threshold point F corresponds to a right threshold distance DR3 of the distance DS. An eye width of the eye diagram corresponds to the left threshold point E meets requirements of the pair of differential transmission lines 31 for the eye diagram. An eye width of the eye diagram corresponds to the right threshold point F meets requirements of the pair of differential transmission lines 31 for the eye diagram. Eye widths of the eye diagram correspond to the other points between the left and right threshold points E, F do not meet requirements of the pair of differential transmission lines 31 for the eye diagram. Therefore, the distance DS is set as a second distance less than or equal to the left threshold distance DL3, or greater than or equal to the third distance DS3'. In a typical layout method, the distance DS increases to, the fourth distance DS4' to increase the eye width. The simulation according to the set conditions shows that layout space can be saved when the distance DS is set to the second distance. For example, when the third distance DS3' is set to the distance DS, 22 mils of layout space can be saved.

Referring to FIG. 5, the distance DS is further capable of being set to a fifth distance DS5' less than the first distance DS1' which maximizes eye height of the eye diagram. The distance DS is also capable of being set to a sixth distance DS6' greater than the first distance DS1' corresponding to an eye height equal to the eye height corresponding to the fifth distance DS5'. In one embodiment, the fifth distance DS5' is 3 mils, and the sixth distance is 25 mils.

The signal waveform has a left threshold point G, and a right threshold point H. The left threshold point G corresponds to a left threshold distance DL4 of the distance DS. The right threshold point H corresponds to a right threshold distance DR4 of the distance DS. An eye height of the eye diagram corresponds to the left threshold point G meets requirement of the pair of differential transmission lines 31 for the eye diagram. An eye height of the eye diagram corresponds to the right threshold point H meets requirement of the pair of differential transmission lines 31 for the eye diagram. Eye heights of the eye diagram correspond to the other points between the left and right threshold points G, H do not meet requirement of the pair of differential transmission lines 31 for the eye diagram. Therefore, the distance DS is set as a second distance less than or equal to the left threshold distance DL4, or greater than or equal to the fifth distance DS5'. In a typical layout method, the distance DS increased to the sixth distance DS6' to increase the eye height. The simulation according to the set conditions shows that layout space can be saved when the distance DS is set to the second distance. For example, when the fifth distance DS5' is set to the distance DS, 22 mils of layout space can be saved.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A printed circuit board comprising:
   a signal layer comprising a pair of differential transmission lines thereon; an eye width and an eye height of an eye diagram obtained at output terminals of the pair of differential transmission lines are variable according to a distance between the pair of differential transmission lines;
   wherein the eye width and the eye height of the eye diagram are at minimum values when the distance between the pair of differential transmission lines is at a first distance; the eye width and the eye height meet requirements of the pair of differential transmission lines for the eye diagram when the distance between the pair of differential transmission lines is set at a second distance, the second distance is less than the first distance.

2. The printed circuit board of claim 1, wherein the eye width and the eye height of the eye diagram are at maximum values when the distance between the pair of differential transmission lines is at a third distance, the third distance being less or equal to the second distance.

3. The printed circuit board of claim 2, a greater one of a first second distance and a second second distance is set as the second distance, wherein the first second distance corresponds to the eye width and the second second distance corresponds to the eye height.

4. The printed circuit board of claim 2, wherein when the distance between the pair of differential transmission lines is greater than the second distance, the eye width and the eye height of the eye diagram decrease; when the distance between the pair of differential transmission lines is less than the second distance, the eye width and the eye height of the eye diagram increase.

5. The printed circuit board of claim 2, wherein when the distance between the pair of differential transmission lines is greater or less than the third distance, the eye width and the eye height of the eye diagram decrease.

6. A printed circuit board comprising:
a signal layer comprising a pair of differential transmission lines thereon; an eye width and an eye height of an eye diagram obtained at output terminals of the pair of differential transmission lines are variable according to a distance between the pair of differential transmission lines;
wherein the eye width and the eye height of the eye diagram obtained at output terminals of the pair of differential transmission lines increase when a distance between the pair of differential transmission lines is greater or less than a first distance; the eye width and the eye height meet requirements of the pair of differential transmission lines for the eye diagram when the distance between the pair of differential transmission lines is set at a second distance, the second distance is less than the first distance.

7. The printed circuit board of claim 6, wherein the eye width and the eye height of the eye diagram are at maximum values when the distance between the pair of differential transmission lines is at a third distance, the third distance being less or equal to the second distance.

8. The printed circuit board of claim 7, a greater one of a first second distance and a second second distance is set as the second distance, wherein the first second distance corresponds to the eye width and the second second distance corresponds to the eye height.

9. The printed circuit board of claim 7, wherein when the distance between the pair of differential transmission lines is greater than the second distance, the eye width and the eye height of the eye diagram decrease; when the distance between the pair of differential transmission lines is less than the second distance, the eye width and the eye height of the eye diagram increase.

10. The printed circuit board of claim 7, wherein when the distance between the pair of differential transmission lines is greater or less than the third distance, the eye width and the eye height of the eye diagram decrease.

* * * * *